(12) United States Patent
Saito et al.

(10) Patent No.: US 9,185,811 B2
(45) Date of Patent: Nov. 10, 2015

(54) METHOD OF PRODUCING PRINTED CIRCUIT BOARD, AND PRINTED BOARD PRODUCED BY THE METHOD

(75) Inventors: Yoichi Saito, Ayase (JP); Shigeru Michiwaki, Ayase (JP); Noriaki Taneko, Ayase (JP); Shukichi Takii, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 163 days.

(21) Appl. No.: 13/642,471

(22) PCT Filed: Mar. 2, 2011

(86) PCT No.: PCT/JP2011/054724
§ 371 (c)(1),
(2), (4) Date: Oct. 19, 2012

(87) PCT Pub. No.: WO2011/132463
PCT Pub. Date: Oct. 27, 2011

(65) Prior Publication Data
US 2013/0043063 A1     Feb. 21, 2013

(30) Foreign Application Priority Data

Apr. 23, 2010     (JP) .................................. 2010-099519

(51) Int. Cl.
*H05K 3/02*     (2006.01)
*H01R 43/00*    (2006.01)
(Continued)

(52) U.S. Cl.
CPC .................. *H05K 3/205* (2013.01); *H05K 3/26* (2013.01); *H05K 2201/0376* (2013.01); *H05K 2201/098* (2013.01); *H05K 2203/0152* (2013.01); *H05K 2203/025* (2013.01); *H05K 2203/1572* (2013.01)

(58) Field of Classification Search
CPC ............. H01L 2924/01079; H05K 2201/0355; H05K 3/3452; H02G 1/1256; Y10T 29/49155; Y10T 29/49117; Y10T 29/49124; Y10T 29/49165; B29K 2021/00
USPC .................... 29/846, 825, 829, 847; 174/250; 156/154
See application file for complete search history.

(56) References Cited

U.S. PATENT DOCUMENTS 4,604,160 A * 8/1986 Murakami et al. ............... 216/18
5,197,184 A * 3/1993 Crumly et al. .................. 29/846
(Continued)

FOREIGN PATENT DOCUMENTS

CN     1489429       4/2004
EP     0545328 A2    6/1993
(Continued)

OTHER PUBLICATIONS
Search Report for PCT/JP2011/054724, mailed Jun. 7, 2011.
(Continued)

*Primary Examiner* — David Angwin
(74) *Attorney, Agent, or Firm* — Marshall, Gerstein & Borun LLP

(57) ABSTRACT

A method of producing a printed circuit board includes: forming a metal layer on a support plate; forming a mask layer on the metal layer; forming a pattern plating having a stem as plating up to a level of the mask layer, and a cap as a portion of plating exceeding the mask layer and having an outgrowth lying over the surface of the mask layer; laminating an insulating base on a conductive circuit board constituted by the support plate, the metal layer and the pattern plating to form a circuit board intermediate in which the pattern plating is buried in the base; removing the support plate and the metal layer to form an exposed surface; and mechanically polishing the exposed surface until the stem of the pattern plating is removed, to increase the width of the conductive pattern on the exposed surface.

3 Claims, 4 Drawing Sheets

(51) Int. Cl.
  *H05K 3/00* (2006.01)
  *H05K 1/00* (2006.01)
  *B29C 65/00* (2006.01)
  *H05K 3/20* (2006.01)
  *H05K 3/26* (2006.01)

(56) References Cited

U.S. PATENT DOCUMENTS

| | | | | |
|---|---|---|---|---|
| 5,358,604 | A * | 10/1994 | Lin et al. | 216/17 |
| 5,369,881 | A * | 12/1994 | Inaba et al. | 29/846 |
| 6,143,116 | A * | 11/2000 | Hayashi et al. | 156/233 |
| 6,898,850 | B2 * | 5/2005 | Kanzawa et al. | 29/846 |
| 7,069,651 | B2 * | 7/2006 | Graham et al. | 29/846 |
| 7,874,066 | B2 * | 1/2011 | Hiroshi et al. | 29/831 |
| 8,033,014 | B2 * | 10/2011 | Yu et al. | 29/846 |
| 8,146,243 | B2 * | 4/2012 | Asami et al. | 29/832 |
| 2001/0023779 | A1 * | 9/2001 | Sugaya et al. | 174/255 |
| 2003/0102153 | A1 * | 6/2003 | Sugaya et al. | 174/256 |
| 2013/0043063 | A1 * | 2/2013 | Saito et al. | 174/250 |

FOREIGN PATENT DOCUMENTS

| | | |
|---|---|---|
| GB | 1023873 A | 3/1966 |
| JP | 05-037157 A | 2/1993 |
| JP | 05-217755 A | 8/1993 |
| JP | 08-181415 A | 7/1996 |
| JP | 2007-250925 A | 9/2007 |
| JP | 2008-098563 A | 4/2008 |

OTHER PUBLICATIONS

Written Opinion for PCT/JP2011/054724, mailed Jun. 7, 2011.
Extended European Search Report for EP 11 77 1803, mailed Jan. 7, 2015.

* cited by examiner

METHOD OF PRODUCING PRINTED CIRCUIT BOARD, AND PRINTED BOARD PRODUCED BY THE METHOD

TECHNICAL FIELD

The present invention relates to a method of producing a printed circuit board by utilizing a transfer process, and a printed circuit board produced by the method.

BACKGROUND ART

It has been known in the art to remove part of a resist to form an exposed area where a pattern is to be formed. The exposed area is subjected to plating process, and as the plating becomes higher than the height of the resist, it spreads over the resist. That portion of the plating which overlies the resist while exceeding the pattern width set in advance by the resist is called outgrowth. Such outgrowth is disclosed in Patent Document 1.

Meanwhile, a transfer process has been known in which a circuit board is fabricated by burying a pattern in an insulating base in order to smoothen the surface of the circuit board (see Patent Document 2, for example). The transfer process includes the step of joining the pattern of plating and an insulating resin together with pressure applied thereto.

However, where a circuit board is fabricated using the transfer process by joining a circuit board intermediate with an outgrowth and an insulating resin together with application of pressure, it is difficult to predict the electrical characteristics of the circuit board because the cross-sectional shape of the pattern plating is complex, with the result that the handleability of the circuit board lowers. In order to prevent the formation of an outgrowth, the height of the resist may be increased. In the case of forming a thick copper plating, however, it is often difficult to form a resist with a height matching the thick copper plating to be formed.

PRIOR ART DOCUMENTS

Patent Documents

Patent Document 1: Unexamined Japanese Patent Publication No. 5-217755
Patent Document 2: Unexamined Japanese Patent Publication No. 5-37157

SUMMARY OF THE INVENTION

Problems to be Solved by the Invention

The present invention provides a method of producing a printed circuit board, whereby electrical characteristics of the circuit board can be stabilized even if an outgrowth is formed, surface flatness of the circuit board can be enhanced, and in the case of forming a thick copper pattern, a resist need not have a height matching the thick copper pattern to be formed, and a printed circuit board produced by the method.

Means for Solving the Problems

To achieve the object, the present invention provides a method of producing a printed circuit board, comprising: forming a metal layer on a support plate; forming a resist layer on the metal layer; forming a mask layer by removing part of the resist layer to form a groove as an exposed area where a conductive pattern is to be formed; subjecting the exposed area to plating process to form a pattern plating, the pattern plating having a stem as a portion of plating up to a level equal to a height of the mask layer, and a cap as a portion of plating exceeding the height of the mask layer and having an outgrowth lying over a surface of the mask layer, as viewed in cross section of the groove; laminating an insulating base on a conductive circuit board constituted by the support plate, the metal layer and the pattern plating, to form a circuit board intermediate in which the pattern plating is buried in the insulating base; removing the support plate and the metal layer from the circuit board intermediate, to form an exposed surface where the conductive pattern and the insulating base are exposed; and mechanically polishing the exposed surface until the stem of the pattern plating is removed, to increase a line width of the conductive pattern on the exposed surface to a width greater than that of the groove.

According to the present invention, in the method of claim 1, the mask layer is removed after the plating process.

Also, according to the present invention, in the method of claim 1, the mask layer is left intact as part of the conductive circuit board when the insulating base is laminated on the conductive circuit board.

The present invention also provides a printed circuit board produced by the method of claim 1.

Advantageous Effects of the Invention

According to the present invention, the exposed surface where the pattern plating is exposed is mechanically polished for flattening until the stem is removed, that is, up to a position where the outgrowth is exposed. Accordingly, the coatability of a solder resist used in a subsequent process improves, and also components can be stably mounted. Even if an outgrowth is formed, complexity of the cross-sectional shape of the pattern plating is eliminated by the mechanical polishing, so that the electrical characteristics of the printed circuit board are stabilized. Also, even in the case of forming a thick copper pattern plating, the resist layer (mask layer) need not have a height matching the thick copper pattern plating to be formed, and thus the height of the thick copper pattern plating to be formed can be freely set as desired.

Generally, it is likely that a stripping solution fails to reach the portion of the mask layer interposed between the outgrowth and the metal layer, with the result that the mask layer partly remains there. According to the present invention, the remaining portion of the mask layer can be removed without fail by the mechanical polishing. It is therefore possible to reliably avoid a situation where the remaining portion of the mask layer falls off after the lamination, creating what is called a void (loss of resin).

According to the present invention, even in the case where the mask layer is formed using what is called a permanent resist, the mask layer is infallibly removed together with the stem by the mechanical polishing. It is therefore possible to prevent the quality of the printed circuit board from being adversely affected by the peeling of the mask layer from the pattern plating.

According to the present invention, a printed circuit board having the aforementioned advantageous effects can be obtained.

MODE FOR CARRYING OUT THE INVENTION

Figure 1:
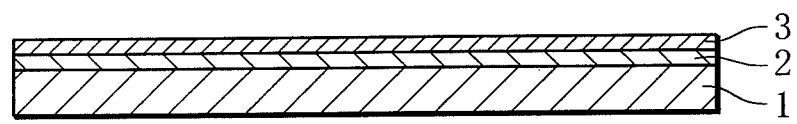
FIG. 1 schematically illustrates a method of producing a printed circuit board according to the present invention.
Figure 2:
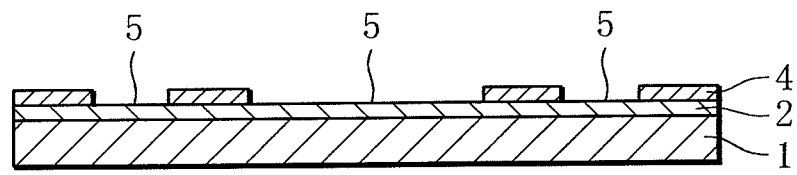
FIG. 2 schematically illustrates the printed circuit board production method of the present invention.

As illustrated in FIG. 1, a metal layer 2 is formed on a support plate 1, and a resist layer 3 is formed on the metal layer 2. The support plate 1 is a SUS plate or the like having electrical conductivity and serves as a transfer base. The metal layer 2 is a base coating and formed, for example, by electrolytically plating the support plate 1 with copper to a thickness of 12 µm. The resist layer 3 is a dry film or the like. Then, as shown in FIG. 2, a predetermined portion of the resist layer 3 is removed by using an exposure-development apparatus (not shown) to form a mask layer 4. Specifically, the portion of the resist layer 3 where a conductive pattern is to be formed is removed to form an exposed area (groove) 5 where the surface of the metal layer 2 is exposed. Thus, the metal layer 2 has the mask layer 4 and the exposed area 5 on its surface.

Figure 3:
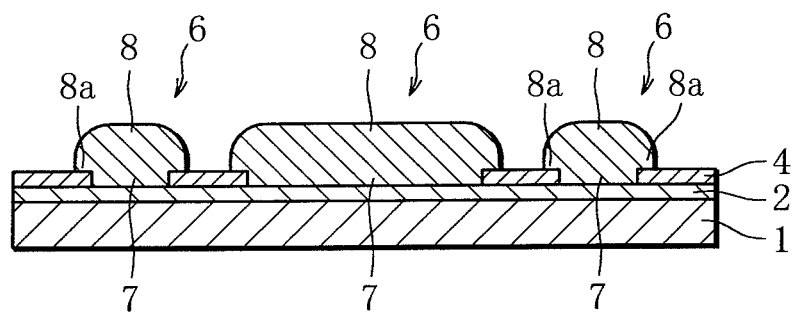
FIG. 3 schematically illustrates the printed circuit board production method of the present invention.
Figure 4:
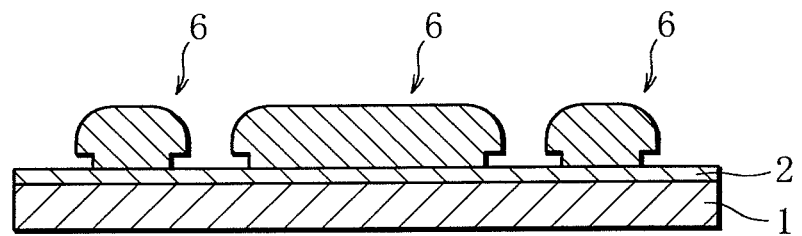
FIG. 4 schematically illustrates the printed circuit board production method of the present invention.

Subsequently, as illustrated in FIG. 3, the exposed area 5 is subjected to plating process. That is, a pattern plating 6 is formed on the exposed area 5. The pattern plating 6 has a stem 7 and a cap 8, as viewed in cross section of the aforementioned groove. The stem 7 is a portion of the plating up to a level equal to the height of the mask layer 4, and the cap 8 is a portion of the plating exceeding the height of the mask layer 4. Since the pattern plating 6 is thus formed so as to be higher in level than the mask layer 4, the cap 8 lies over the surface of the mask layer 4. A portion of the cap 8 lying over the surface of the mask layer 4 is an outgrowth 8a. Accordingly, the outgrowth 8a forms part of the cap 8. Then, as shown in FIG. 4, the mask layer 4 is removed using a stripping solution or the like, whereupon a conductive circuit board 9 is obtained. Specifically, the conductive circuit board 9 is constituted by the support plate 1, the metal layer 2, and the pattern plating 6. Where a permanent resist is used as the mask layer 4 as mentioned later, however, the mask layer 4 also is an element constituting the conductive circuit board 9.

Figure 5:
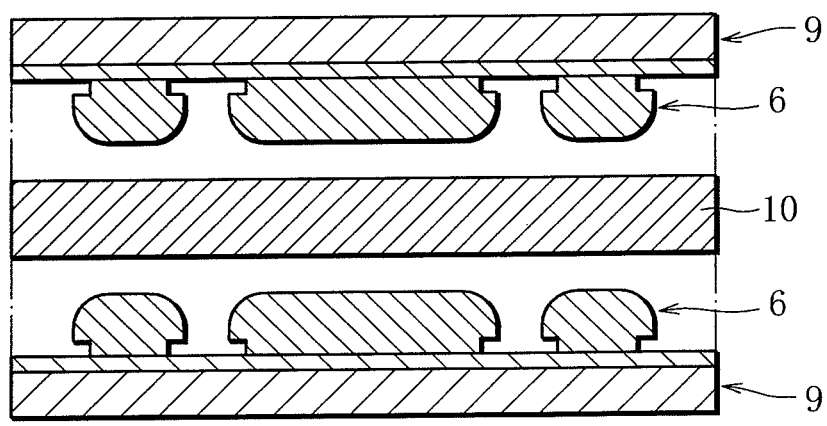
FIG. 5 schematically illustrates the printed circuit board production method of the present invention.
Figure 6:
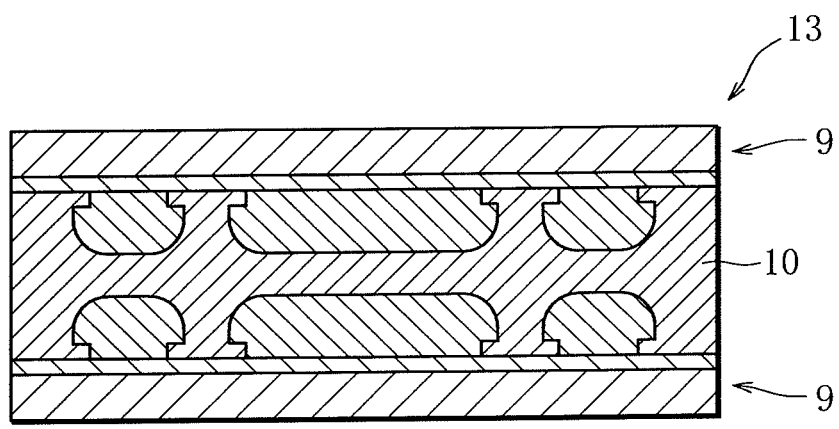
FIG. 6 schematically illustrates the printed circuit board production method of the present invention.

Then, as illustrated in FIG. 5, another conductive circuit board 9 and an insulating base 10 are prepared, and the two conductive circuit boards 9 and the insulating base 10 are joined together with application of pressure, as shown in FIG. 6. The figures exemplify the case of fabricating a double-sided circuit board having an electrical conductive pattern formed on both sides thereof. Specifically, the insulating base 10, which is a prepreg or the like, is sandwiched between the two conductive circuit boards 9. At this time, the conductive circuit boards 9 are placed such that their plated surfaces, namely, the surfaces having the pattern plating 6 formed thereon, face the insulating base 10. The conductive circuit boards 9 and the insulating base 10 are joined together with application of pressure and laminated, to obtain a circuit board intermediate 13 shown in FIG. 6. During the lamination, the insulating base 10 is forced in between adjacent coatings of the pattern plating 6 and between the outgrowth 8a and the metal layer 2. As a result, the pattern plating 6 is buried in the insulating base 10. In the case of fabricating a single-sided circuit board having a conductive pattern formed on one side thereof, the conductive circuit board 9 is laminated on only one side of the insulating base 10. The double- and single-sided circuit boards fabricated in this manner can of course be used as intermediate and outermost layers of a multilayer circuit board.

Figure 7:
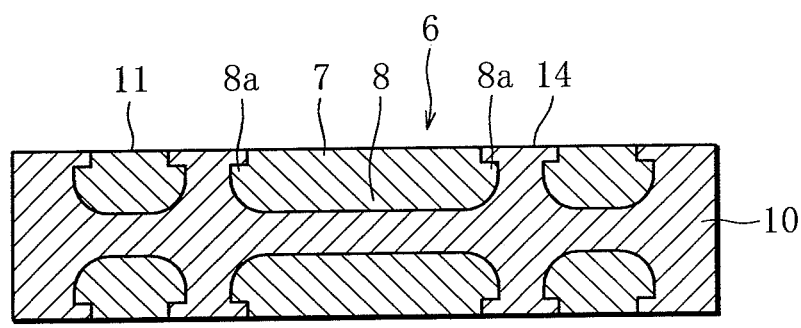
FIG. 7 schematically illustrates the printed circuit board production method of the present invention.
Figure 8:
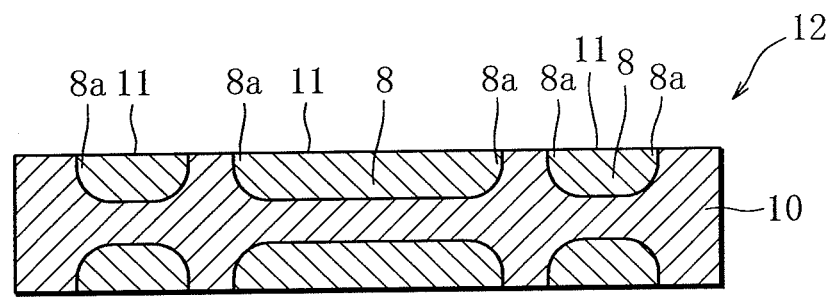
FIG. 8 schematically illustrates the printed circuit board production method of the present invention.

Subsequently, as illustrated in FIG. 7, the support plate 1 and the metal layer 2 are removed from the circuit board intermediate 13, so that an electrically conductive pattern 11 and the insulating base 10 are exposed, forming an exposed surface 14. The conductive pattern 11 is formed by the exposed surface of the aforementioned stem 7. Then, as shown in FIG. 8, the exposed surface 14 (in the illustrated example, the opposite exposed surfaces) is mechanically polished to be flattened. This makes it possible to improve the coatability of a solder resist used in a subsequent process, and also to stabilize the mounting of components. The physical polishing (mechanical polishing) is effected so that the stem 7 may be removed in its entirety, that is, up to a position where the outgrowth 8a is exposed. Since the outgrowth 8a is exposed, the line width of the conductive pattern 11 increases. Thus, although the outgrowth 8a is formed, complexity of the cross-sectional shape of the pattern plating 6 is eliminated by the mechanical polishing, so that a produced printed circuit board 12 has stable electrical characteristics. In this manner, according to the present invention, the outgrowth 8a is purposely formed, and therefore, even in the case of forming the copper pattern plating 6 with a large thickness, the resist layer 3 (mask layer 4) need not have a height matching the thick copper pattern plating 6 to be formed, and the height of the copper plating pattern to be formed can be freely set as desired.

For the mechanical polishing, wet polishing using a buffing roll of nonwoven fabric, wet polishing using a ceramic buffing roll, wet polishing using an abrasive belt (what is called a belt sander) or the like may be employed.

In the aforementioned example, the mask layer 4 is removed after the plating process. Generally, it is likely that the stripping solution fails to reach the portion of the mask layer 4 interposed between the outgrowth 8a and the metal layer 2, with the result that the mask layer 4 partly remains there. The remaining portion of the mask layer 4 can be removed without fail by the aforementioned mechanical polishing. It is therefore possible to reliably avoid a situation where the remaining portion of the mask layer 4 falls off after the lamination, creating what is called a void (loss of resin).

Where a permanent resist is used as the mask layer 4 as stated above, the mask layer 4 may be left intact as part of the conductive circuit board 9 when the insulating base 10 is laminated on the conductive circuit board 9. Even in such case, the remaining mask layer 4 is infallibly removed together with the stem 7 by the mechanical polishing. It is therefore possible to prevent the quality of the printed circuit board from being adversely affected by the peeling of the mask layer 4 from the pattern plating 6.

EXPLANATION OF REFERENCE SIGNS 1 support plate
2 metal layer
3 resist layer
4 mask layer
5 exposed area
6 pattern plating
7 stem
8 cap 8a outgrowth
9 conductive circuit board
10 insulating base
11 pattern
12 printed circuit board
13 circuit board intermediate
14 exposed surface

The invention claimed is:

1. A method of producing a printed circuit board, comprising:
- forming a metal layer on a support plate;
- forming a resist layer on the metal layer;
- forming a mask layer by removing part of the resist layer where a conductive pattern is to be formed to form a groove in the resist layer that exposes the metal layer;
- subjecting the groove to a plating process to form a pattern plating whereby a conductive circuit board is formed, the pattern plating having a stem as a portion of plating up to a level equal to a height of the mask layer, and a cap as a portion of plating exceeding the height of the mask layer and having an outgrowth lying over a surface of the mask layer, as viewed in cross section of the groove;
- after the subjecting, laminating an insulating base on the conductive circuit board to form a circuit board intermediate in which the pattern plating is buried in the insulating base;
- after the laminating, removing the support plate and the metal layer from the circuit board intermediate to form an exposed surface where the conductive pattern and the insulating base are exposed; and
- after the removing, mechanically polishing the exposed surface until the stem of the pattern plating is removed, to increase a line width of the conductive pattern on the exposed surface to a width greater than that of the groove.

2. The method according to claim 1, wherein the mask layer is removed after the plating process.

3. The method according to claim 1, wherein the mask layer is left intact as part of the conductive circuit board when the insulating base is laminated on the conductive circuit board.

* * * * *